US010692800B2

(12) United States Patent
Itoh et al.

(10) Patent No.: US 10,692,800 B2
(45) Date of Patent: Jun. 23, 2020

(54) SEMICONDUCTOR DEVICE HAVING SUBSTRATE AND BASE PLATE JOINED BY JOINING MEMBER

(71) Applicant: FUJI ELECTRIC CO., LTD., Kawasaki-shi, Kanagawa (JP)

(72) Inventors: Taichi Itoh, Matsumoto (JP); Seiichi Takahashi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/908,266

(22) Filed: Feb. 28, 2018

(65) Prior Publication Data
US 2018/0301397 A1 Oct. 18, 2018

(30) Foreign Application Priority Data

Apr. 17, 2017 (JP) ................. 2017-081631

(51) Int. Cl.
*H01L 23/498* (2006.01)
*H01L 23/492* (2006.01)
*H01L 23/58* (2006.01)
*H01L 23/15* (2006.01)
*H01L 23/373* (2006.01)

(52) U.S. Cl.
CPC ........... *H01L 23/492* (2013.01); *H01L 23/15* (2013.01); *H01L 23/49844* (2013.01); *H01L 23/585* (2013.01); *H01L 23/3735* (2013.01); *H01L 23/498* (2013.01); *H01L 2224/06181* (2013.01);
(Continued)

(58) Field of Classification Search
CPC . H01L 2224/73265; H01L 2224/06181; H01L 2224/32225; H01L 2224/48227; H01L 2224/48091; H01L 2924/1301; H01L 2924/1305; H01L 2924/13055; H01L 2924/13091; H01L 23/3735; H01L 23/492; H01L 23/15; H01L 23/49844; H01L 23/585; H01L 23/498; H01L 23/142; H01L 3/34; H05K 3/34
See application file for complete search history.

(56) References Cited

U.S. PATENT DOCUMENTS

| | | | |
|---|---|---|---|
| 7,138,618 B2 * | 11/2006 | Mishina | H01L 27/14603 250/208.1 |
| 2004/0149689 A1 * | 8/2004 | Ning | H01L 21/4875 216/83 |
| 2014/0339606 A1 * | 11/2014 | Lin | H01L 27/14685 257/228 |

FOREIGN PATENT DOCUMENTS

| | | | |
|---|---|---|---|
| JP | 2011100864 A | * | 5/2011 |
| JP | 2017-005137 A | | 1/2017 |

* cited by examiner

*Primary Examiner* — Nelson Garces
(74) *Attorney, Agent, or Firm* — Rabin & Berdo, P.C.

(57) ABSTRACT

In a semiconductor device, the marginal edge of a resist member on the side closer to a substrate is between first and third positions on a metal base plate. The third position is directly under an outer side surface of a metal plate. The first position is outside the third position and is away from a second position on the metal base plate directly under an outer side surface of the electrical insulating board, by a distance calculated by dividing "the height from a principal surface of the metal base plate to the front surface of the electrical insulating board" by "the tangent of the contact angle of solder created by the marginal edge stopping solder flow". This makes it possible to ensure sufficient insulation distances between conductive patterns and the solder and to reduce creepage distances of the conductive patterns over the electrical insulating board.

14 Claims, 10 Drawing Sheets

(52) U.S. Cl.
CPC ............... *H01L 2224/32225* (2013.01); *H01L 2224/48227* (2013.01); *H01L 2224/73265* (2013.01)

SEMICONDUCTOR DEVICE HAVING SUBSTRATE AND BASE PLATE JOINED BY JOINING MEMBER

CROSS-REFERENCE TO RELATED APPLICATION

This application is based upon and claims the benefit of priority of the prior Japanese Patent Application No. 2017-081631, filed on Apr. 17, 2017, the entire contents of which are incorporated herein by reference.

BACKGROUND OF THE INVENTION

1. Field of the Invention

The embodiments discussed herein relate to a semiconductor device.

2. Background of the Related Art

Semiconductor devices include, for example, semiconductor elements, such as Insulated Gate Bipolar Transistors (IGBTs) and power Metal Oxide Semiconductor Field Effect Transistors (MOSFETs). Such semiconductor devices are used as power converting devices, for example.

A semiconductor device of this type will now be described with reference to FIGS. 9 and 10.

Figure 9:
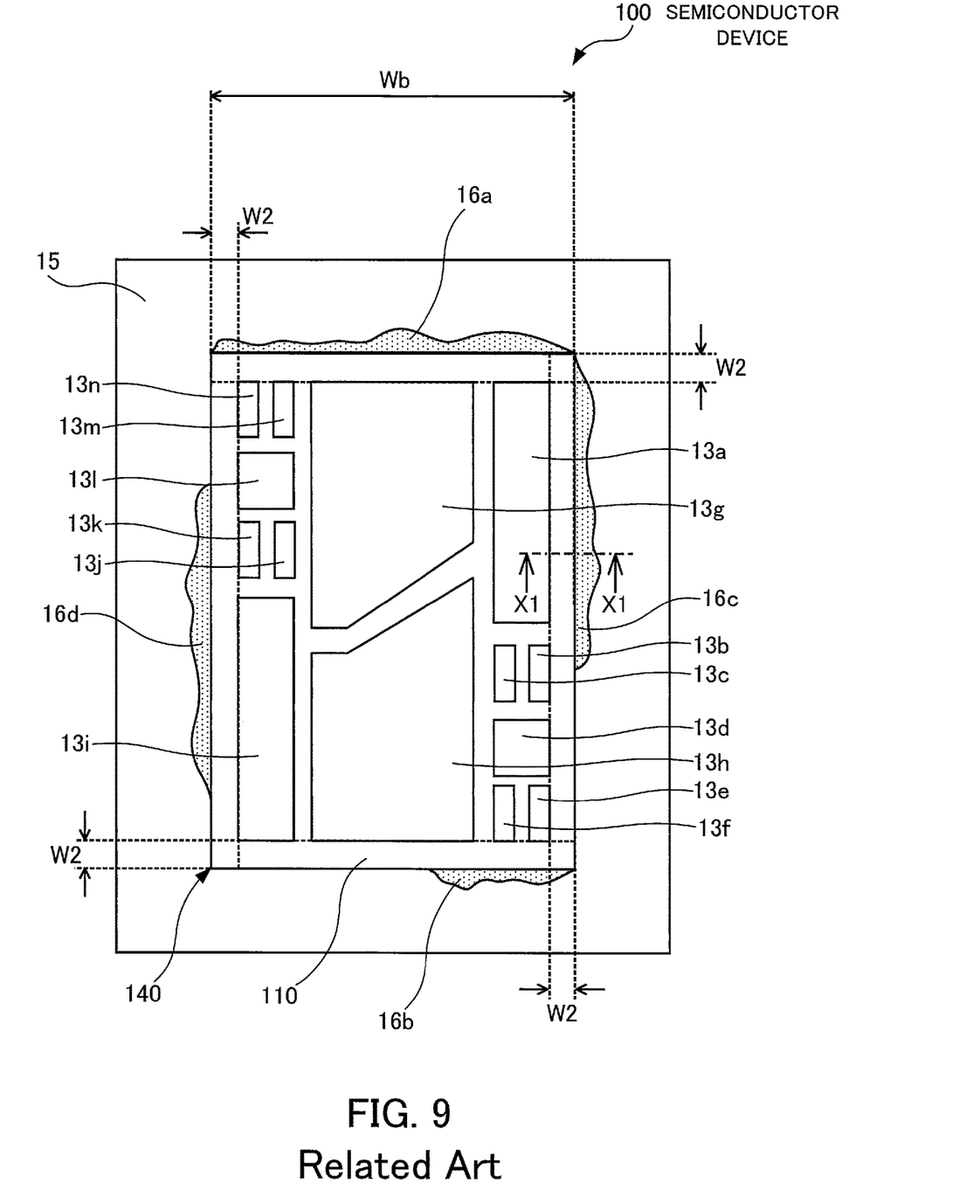
FIG. 9 is a plan view of a conventional semiconductor device.
Figure 10:
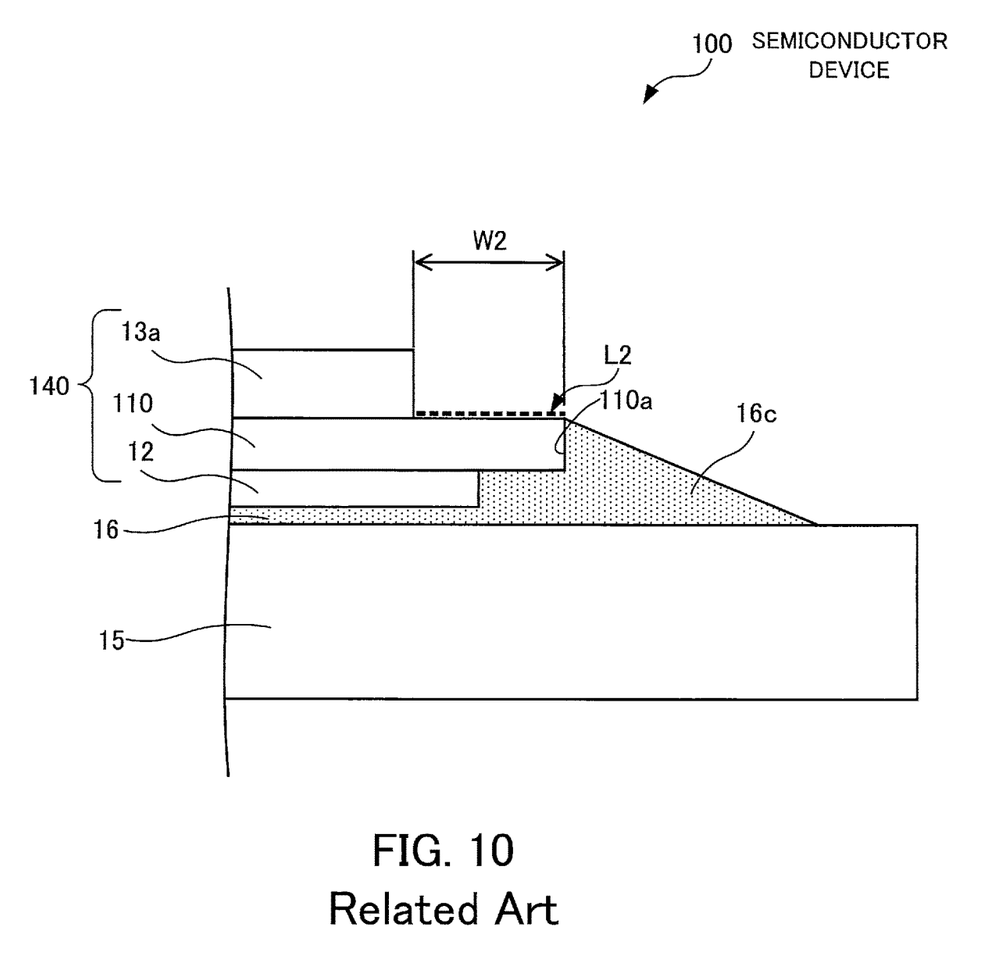
FIG. 10 is a cross-sectional view of the conventional semiconductor device.

FIG. 9 is a plan view of a conventional semiconductor device, and FIG. 10 is a cross-sectional view of the conventional semiconductor device. In this connection, FIG. 10 is a cross-sectional view taken along a dot-dash line X1-X1 in FIG. 9.

The semiconductor device 100 includes a substrate 140 and a metal base plate 15 to which the substrate 140 is joined by solder 16.

The substrate 140 includes an electrical insulating board 110, a metal plate 12 disposed on the rear surface of the electrical insulating board 110, and conductive patterns 13a to 13n formed on the front surface of the electrical insulating board 110. Semiconductor elements, bonding wires, and external connection terminals, and others not illustrated are joined to the conductive patterns 13a to 13n. The metal plate 12 in the substrate 140 is joined to the metal base plate 15 by the solder 16.

If a small amount of solder 16 is applied in this semiconductor device 100, voids or non-joined areas may occur in the solder 16 between the substrate 140 and the metal base plate 15. Voids or others in the solder 16 reduce the thermal conductivity of the substrate 140 to the metal base plate 15, which leads to a reduction in reliability of the semiconductor device 100. To prevent the occurrence of voids and others, the amount of solder 16 is adjusted such that some solder 16 protrudes to some extent from the periphery of the substrate 140 on the metal base plate 15. Referring to the semiconductor device 100 of FIG. 9, extrusions 16a, 16b, 16c, and 16d of the solder 16 protrude from the periphery of the substrate 140 toward the periphery of the metal base plate 15. Therefore, as illustrated in FIG. 10, the extrusion 16c of the solder 16 protruding from the substrate 140 covers the side surface 110a of the electrical insulating board 110 in the substrate 140, so that the conductive pattern 13a and the extrusion 16c of the solder 16 have an insulation distance L2 therebetween, as indicated by a dotted line.

For joining the substrate 140 to the metal base plate 15 by the solder 16, a solder resist having an opening at a position corresponding to where the substrate 140 is disposed on the metal base plate 15 is formed on the metal base plate 15. By doing so, it becomes possible to perform an appropriate positional alignment of the substrate 140. In addition, it is also possible to prevent solder balls from occurring due to splashes of the solder 16 at the removal of voids when the solder 16 melts. For example, refer to Japanese Laid-open Patent Publication No. 2017-5137.

However, in the above semiconductor device 100, the conductive pattern 13a and the extrusion 16c of the solder 16 have a short insulation distance L2 therebetween since the extrusion 16c of the solder 16 protrudes from the substrate 140 as illustrated in FIG. 10. The short insulation distance L2 may generate a short circuit between the conductive pattern 13a and the extrusion 16c of the solder 16, and this causes a problem of insulation breakdown.

To keep a sufficient insulation distance L2 so as not to cause insulation breakdown in this semiconductor device 100, the conductive pattern 13a need to have a long creepage distance W2 over the electrical insulating board 110. However, the substrate 140 needs to be enlarged for the long creepage distance W2, and this causes a problem of increasing the size of the semiconductor device 100.

SUMMARY OF THE INVENTION

According to one aspect, there is provided a semiconductor device including: a substrate having a front surface and a rear surface, and including a conductive pattern having a first side surface, an electrical insulating board having the conductive pattern on a front surface thereof, and having a second side surface parallel to the first side surface, and a metal plate disposed on a rear surface of the electrical insulating board, having a third side surface parallel to the first and second side surfaces, the metal plate having a size that is smaller than a size of the electrical insulating board in a plan view so that the electrical insulating board extends beyond the metal plate; a base plate having a principal surface to which the metal plate in the substrate is joined by a joining member; and a resist member formed in a stripe shape on the base plate in parallel to the first side surface in a plan view, wherein the base plate has first, second, and third positions defined thereon in a cross-sectional view, the first position being outwardly away from the third position, the second position being directly under the second side surface, the third position being directly under the third side surface, wherein the resist member has a marginal edge on a side closer to the substrate, and the marginal edge is located between the third position and the first position in the cross-sectional view, and wherein the first position is away from the second position by a distance calculated by dividing "a height from the principal surface of the base plate to the front surface of the electrical insulating board" by "a tangent of a contact angle between the base plate and the joining member".

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings, wherein like reference numerals refer to like elements throughout.

First Embodiment

A semiconductor device of a first embodiment will be described with reference to FIGS. 1 to 3.

Figure 1:
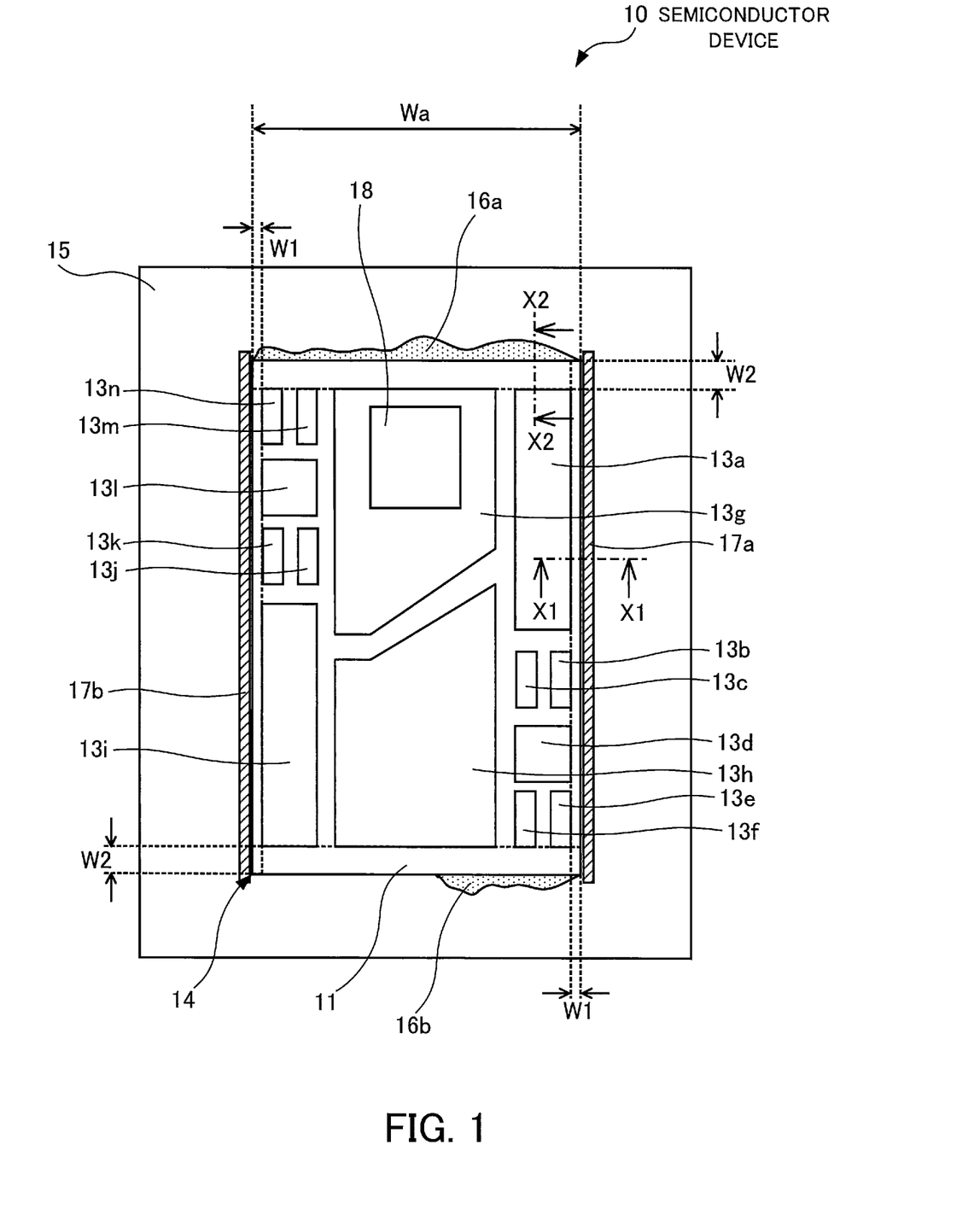
FIG. 1 is a plan view of a semiconductor device according to a first embodiment.

FIG. 1 is a plan view of a semiconductor device according to the first embodiment.

Figure 2:
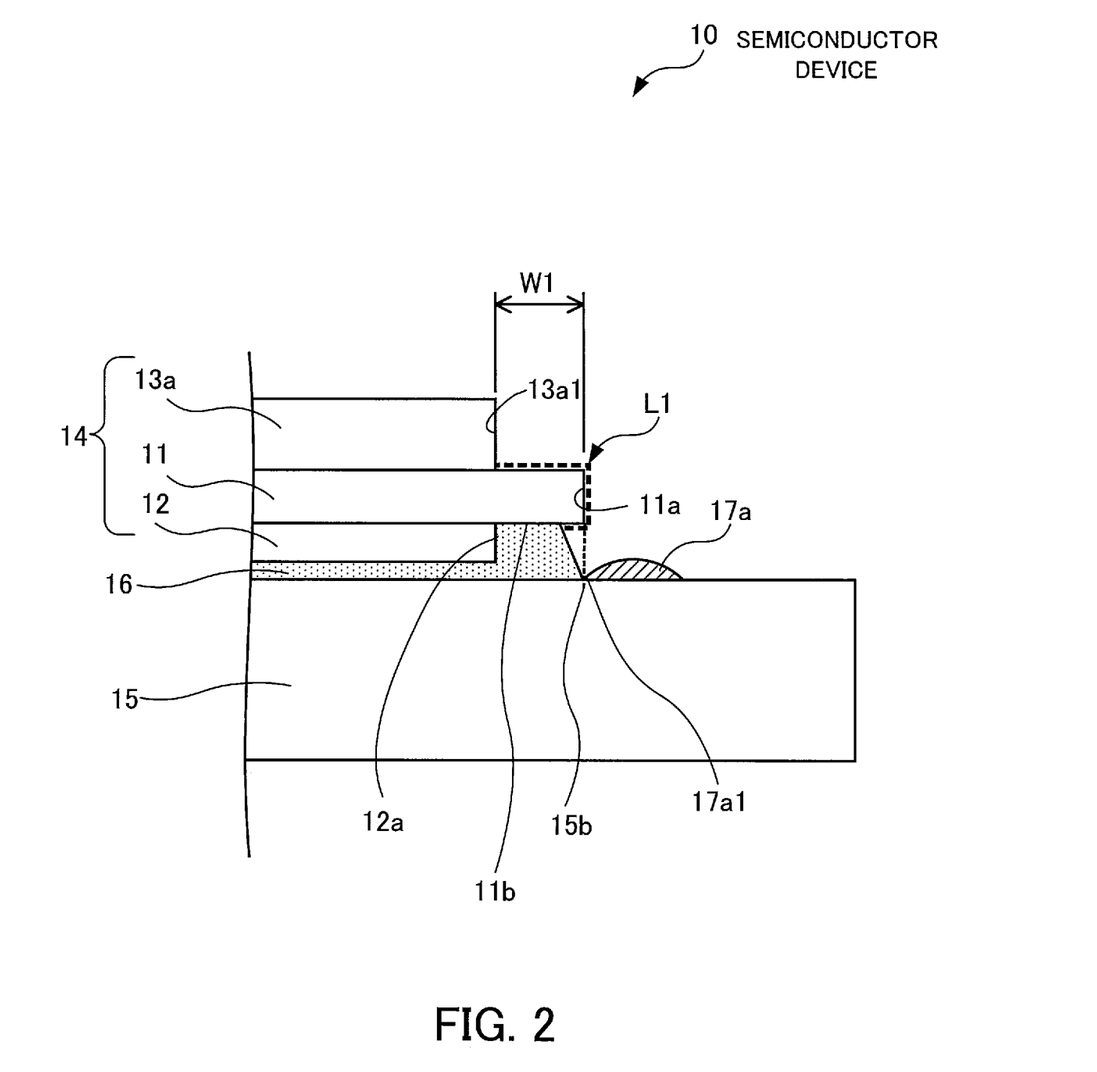
FIG. 2 is a cross-sectional view of a portion with a resist member in the semiconductor device according to the first embodiment.

FIG. 2 is a cross-sectional view of a portion with a resist member in the semiconductor device according to the first embodiment. FIG. 3 is a cross-sectional view of a portion without a resist member in the semiconductor device according to the first embodiment. In this connection, FIG. 2 is a cross-sectional view taken along a dot-dash line X1-X1 in FIG. 1, and FIG. 3 is a cross-sectional view taken along a dot-dash line X2-X2 in FIG. 1.

The semiconductor device 10 includes a substrate 14, a semiconductor element 18 disposed on the substrate 14 via solder not illustrated, and a metal base plate 15 (base plate) to which the substrate 14 is joined by solder 16 (joining member).

Hereinafter, conductive patterns 13a to 13n will be collectively referred to as conductive patterns 13 unless otherwise specified.

The substrate 14 includes an electrical insulating board 11, a metal plate 12 disposed on the rear surface of the electrical insulating board 11, and the conductive patterns 13a to 13n formed on the front surface of the electrical insulating board 11. In this connection, the substrate 14 has a vertical length of 20 mm to 100 mm both inclusive and a horizontal length of 10 mm to 60 mm both inclusive in a planar view.

The electrical insulating board 11 is made of ceramics with high thermal conductivity, such as aluminum oxide, aluminum nitride, or silicon nitride. In this connection, the electrical insulating board 11 has a thickness of 0.1 mm to 1.0 mm both inclusive.

The metal plate 12 is made of metal with high thermal conductivity, such as aluminum, iron, silver, copper, or an alloy containing at least one of these. In this connection, the metal plate 12 has a thickness of 0.1 mm to 4.0 mm both inclusive.

The conductive patterns 13a to 13n are made of metal with high conductivity, such as copper or a copper alloy. In this connection, the conductive patterns 13a to 13n formed on the electrical insulating board 11 are just an example, and such conductive patterns may be formed in another shape, or any number of conductive patterns may be formed. In this connection, the conductive patterns 13a to 13n have a thickness of 0.1 mm to 4.0 mm both inclusive.

In addition, the conductive patterns 13a to 13n are arranged on the electrical insulating board 11 with the following creepage distances from the individual sides of the electrical insulating board 11. The conductive patterns 13a, 13b, 13d, and 13e, or more specifically the outer side surfaces thereof in the right part of FIG. 1 have a creepage distance W1 from the right side of the electrical insulating board in FIG. 1. Hereinafter, side surfaces of the conductive patterns 13a to 13n facing the periphery of the substrate 14 are referred to as first side surfaces. For example, referring to FIG. 2, a side surface 13a1 is a first side surface. The first side surfaces of the conductive patterns 13e, 13f, 13h, and 13i, illustrated in the lower part of FIG. 1, have a creepage distance W2 from the bottom side of the electrical insulating board 11 in FIG. 1. The first side surfaces of the conductive patterns 13i, 13k, 13l, and 13n, illustrated in the left part of FIG. 1, have the creepage distance W1 from the left side of the electrical insulating board 11 in FIG. 1. The first side surfaces of the conductive patterns 13m, 13n, 13g, and 13a, illustrated in the upper part of FIG. 1, have the creepage distance W2 from the top side of the electrical insulating board 11 in FIG. 1. In this connection, for example, the creepage distance W1 is 0.6 mm, and the creepage distance W2 is 1.5 mm, which is longer than the creepage distance W1.

As the substrate 14 configured as above, a Direct Copper Bonding (DCB) substrate or an Active Metal Brazed (AMB) substrate may be used, for example. The substrate 14 conducts heat generated by the semiconductor element 18 to the metal base plate 15 through the conductive patterns 13, the electrical insulating board 11, the metal plate 12, and the solder 16 applied between the metal plate 12 and the metal base plate 15.

Examples of the semiconductor element 18 include a switching element, such as an IGBT or power MOSFET. The semiconductor element 18 of this type has a drain electrode or a collector electrode as a main electrode on its rear surface, and a gate electrode and one of a source electrode and an emitter electrode as main electrodes on its front surface, for example.

In addition, the semiconductor element 18 includes a diode, such as Schottky Barrier Diode (SBD) or FreeWheeling Diode (FWD), as needed. The semiconductor element 18 of this type has a cathode electrode as a main electrode on its rear surface, and an anode electrode as a main electrode on its front surface.

The rear surface of the semiconductor element 18 is joined to the conductive pattern 13g by solder not illustrated, for example. However, the arrangement of the semiconductor element 18 is not limited thereto, and a plurality of semiconductor elements may be joined to the conductive patterns 13 as needed.

In this connection, bonding wires not illustrated are provided on the substrate 14 to electrically connect the conductive patterns 13 with each other, and a prescribed conductive pattern 13 and the semiconductor element 18 with each other. In this way, a prescribed circuit including the semiconductor element 18 is configured.

Lead-free silver-, gold-, copper-, or tin-based solder is used as the solder 16, for example. In order to join the substrate 14 to the metal base plate 15, solder paste is applied to or a solder plate is mounted on a joining area of the metal base plate 15 where the substrate 14 is to be placed, and then the substrate 14 is mounted thereon. Then, the solder paste or solder plate is melted by heating, and then solidified. As a result, the metal plate 12 in the substrate 14 is joined to the metal base plate 15 by the solder 16. In this connection, the solder 16 between the metal base plate 15 and the metal plate 12 has a thickness of 0.05 mm to 0.5 mm both inclusive.

At this time, because the flow direction of the solder 16 varies according to the warped state of the metal base plate 15 and because there is a misalignment of the substrate 14 with respect to the metal base plate 15, the solder 16 flows out from the periphery of the substrate 14.

However, it is difficult to expect a place from which the solder 16 flows out. For example, in the case of FIG. 1, resist members 17a and 17b are formed in parallel on the right and left sides of the substrate 14 on the metal base plate 15, as will be described later. These resist members 17a and 17b do not allow the solder 16 to flow out from the right and left sides of the substrate 14. However, extrusions 16a and 16b of the solder 16 protrude from the top and bottom sides of the substrate 14.

The metal base plate 15 is made of, for example, a material with high thermal conductivity, such as aluminum, iron, silver, copper, or an alloy containing at least one of these, a composite material including aluminum and silicon carbide, a composite material including magnesium and silicon carbide, or another. In addition, to improve corrosion resistance, for example, a material, such as nickel, may be applied to the surface of the metal base plate 15 by a plating process or the like. Examples of the material include, other than nickel, a nickel-phosphorus alloy, a nickel-boron alloy, and others.

In addition, on the metal base plate 15, the resist members 17a and 17b are formed in a stripe shape along the right and left sides of the substrate in FIG. 1. The resist members 17a and 17b are formed so as not to allow the solder 16 to flow out to unwanted areas, for example, outwardly from the right and left sides of the substrate 14 in FIG. 1. These resist members 17a and 17b are made of a material having a poorer solder wettability than the metal base plate 15. For example, an organic material, such epoxy resin or acrylic resin, or an inorganic material, such as carbon or silicate, may be used. The resist members 17a and 17b formed on the metal base plate 15 have a width of 0.2 mm to 5.0 mm both inclusive.

In this connection, in order to improve heat dissipation, a cooling unit not illustrated may be joined to the rear surface of the metal base plate 15 by solder, silver solder, or the like, or may be mechanically joined thereto by thermal paste or the like. The cooling unit in this case may be made of, for example, a material with high thermal conductivity, such as aluminum, iron, silver, copper, or an alloy containing at least one of these. As the cooling unit, fins or a heat sink with a plurality of fins, and a cooling device employing water cooling may be used. In addition, the metal base plate 15 may be formed integrally with such a cooling unit. In this case, the cooling unit is made of a material with high thermal conductivity, such as aluminum, iron, silver, or copper, or a material containing at least one of these. In addition, in order to improve corrosion resistance, for example, a material, such as nickel, may be applied to the surface of a heat dissipation plate formed integrally with a cooling unit by a plating process or the like. Specific examples of the material include, other than nickel, a nickel-phosphorus alloy, a nickel-boron alloy, and others.

In the semiconductor device 10 configured as above, the resist members 17a and 17b are formed in a stripe shape on the right and left sides of the substrate 14 on the metal base plate 15 in FIG. 1. These resist members 17a and 17b do not allow the solder 16 to flow out from the right and left sides of the substrate 14 toward the periphery of the metal base plate 15 in the semiconductor device 10. For example, on the right side of the substrate 14 in FIG. 1, a marginal edge 17a1 of the resist member 17a on the side closer to the substrate 14 is located at a position 15b directly under the side surface 11a of the electrical insulating board 11, as illustrated in FIG. 2. In this case, the resist member 17a stops the solder 16 from flowing out from between the substrate and the metal base plate 15. While the solder 16 does not flow out from the substrate 14 and partly covers the rear surface 11b of the projecting portion of the electrical insulating board 11, it does not cover the side surface 11a of the electrical insulating board 11. As a result, the conductive pattern 13a has an insulation distance L1, indicated by a broken line, from the solder 16 without fail. The insulation distance L1 is desirable to include at least part of the length equal to the height of the side surface 11a of the electrical insulating board 11. If such is the case, it is possible to reduce the creepage distance W1 of the conductive pattern 13a over the electrical insulating board 11. More specifically, it is possible to reduce the creepage distance W1 to shorter than at least the creepage distance W2 in the case where the resist members 17a and 17b are not formed. Therefore, for example, it is possible to reduce the width Wa of the substrate 14 in FIG. 1 to smaller than the width Wb of the substrate 140 without resist members in FIG. 9, and thus to miniaturize the semiconductor device 10. Alternatively, it is possible to increase the arrangement area of the conductive patterns 13 in the width Wa direction of the substrate 14 in FIG. 1.

In this connection, the semiconductor device illustrated in FIG. 1 may be configured with the resist members 17a and 17b formed on the top and bottom sides of the substrate 14, instead of the right and left sides of the substrate 14. However, if the resist members 17a and 17b are formed on the top, bottom, left, and right sides of the substrate 14 in FIG. 1 such as to surround the periphery of the substrate 14, the solder 16 is not able to flow out in a soldering process, and therefore spatters on the conductive patterns 13a to 13n, semiconductor element 18, and others. The spattering of the solder 16 causes a short circuit between the conductive patterns 13a to 13n and the semiconductor element 18, which results in a reduction in the reliability of the semiconductor device 10. To prevent this problem, there is a need to ensure a space for allowing the solder 16 to flow out when the resist members 17a and 17b are formed around the periphery of the substrate 14. It is more preferable to form the resist members 17a and 17b along opposite sides of the periphery of the substrate 14. This allows the solder 16 to flow out smoothly under the substrate 14 in the soldering process. In addition, it is possible to reduce the creepage distance and to prevent a local flow or spattering of the solder 16.

In this connection, in the semiconductor device 10 of FIG. 1, the extrusions 16a and 16b of the solder 16 protrude from the substrate 14 toward the periphery of the metal base plate 15 on the top and bottom sides of the substrate 14 where the resist members 17a and 17b are not formed. For example, as illustrated in FIG. 3, in the semiconductor device 10, the extrusion 16a of the solder 16 protrudes from between the substrate 14 and the metal base plate 15 on the top side of the substrate 14 on the metal base plate 15 in FIG. 1, and so covers the side surface 11a of the electrical insulating board 11. Therefore, in order that the conductive pattern 13a has a sufficient insulation distance L2 from the extrusion 16a of the solder 16, the creepage distance W2 of the conductive pattern 13a over the electrical insulating board 11 needs to be set longer than the creepage distance W1.

Figure 4:
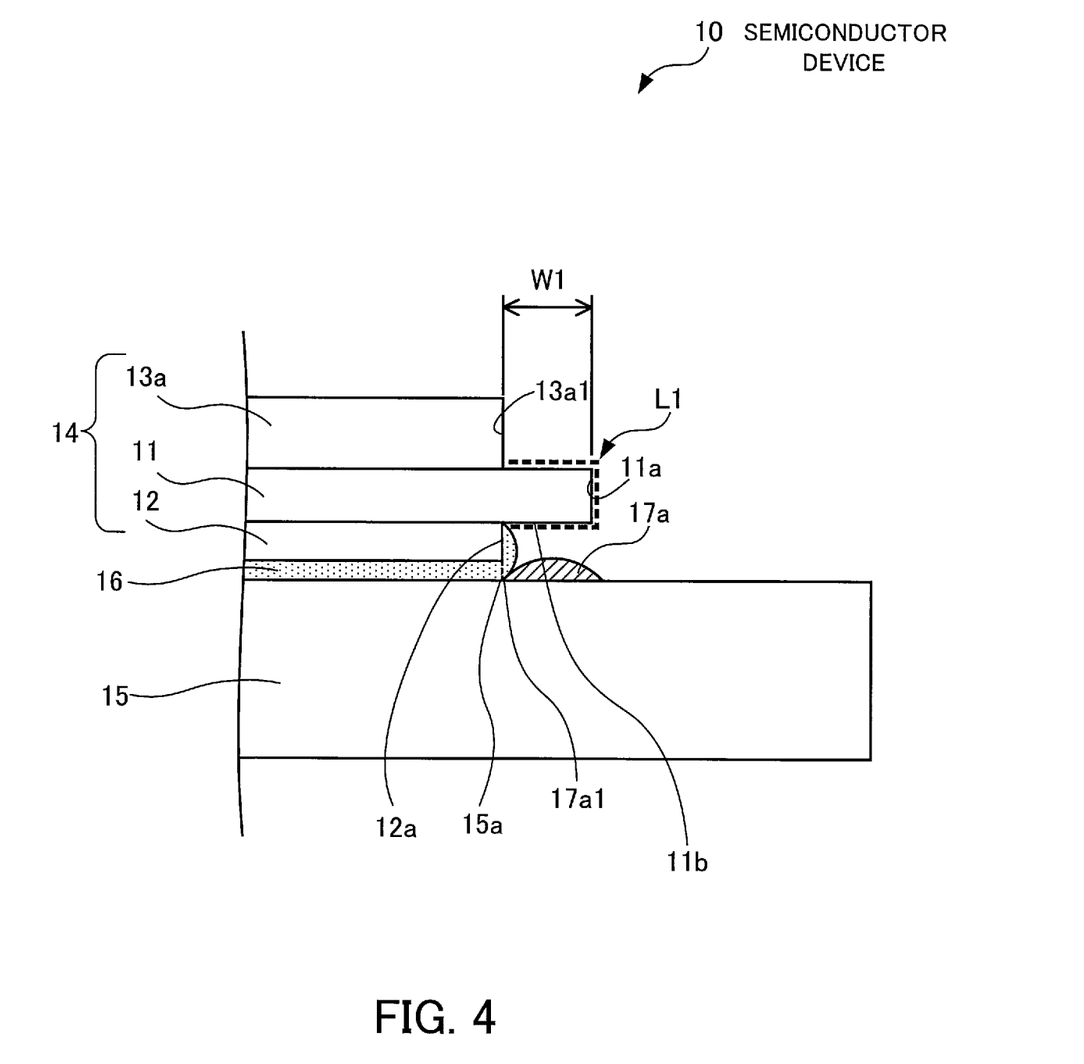
FIG. 4 is a cross-sectional view for explaining where a resist member is formed in the semiconductor device according to the first embodiment.
Figure 5:
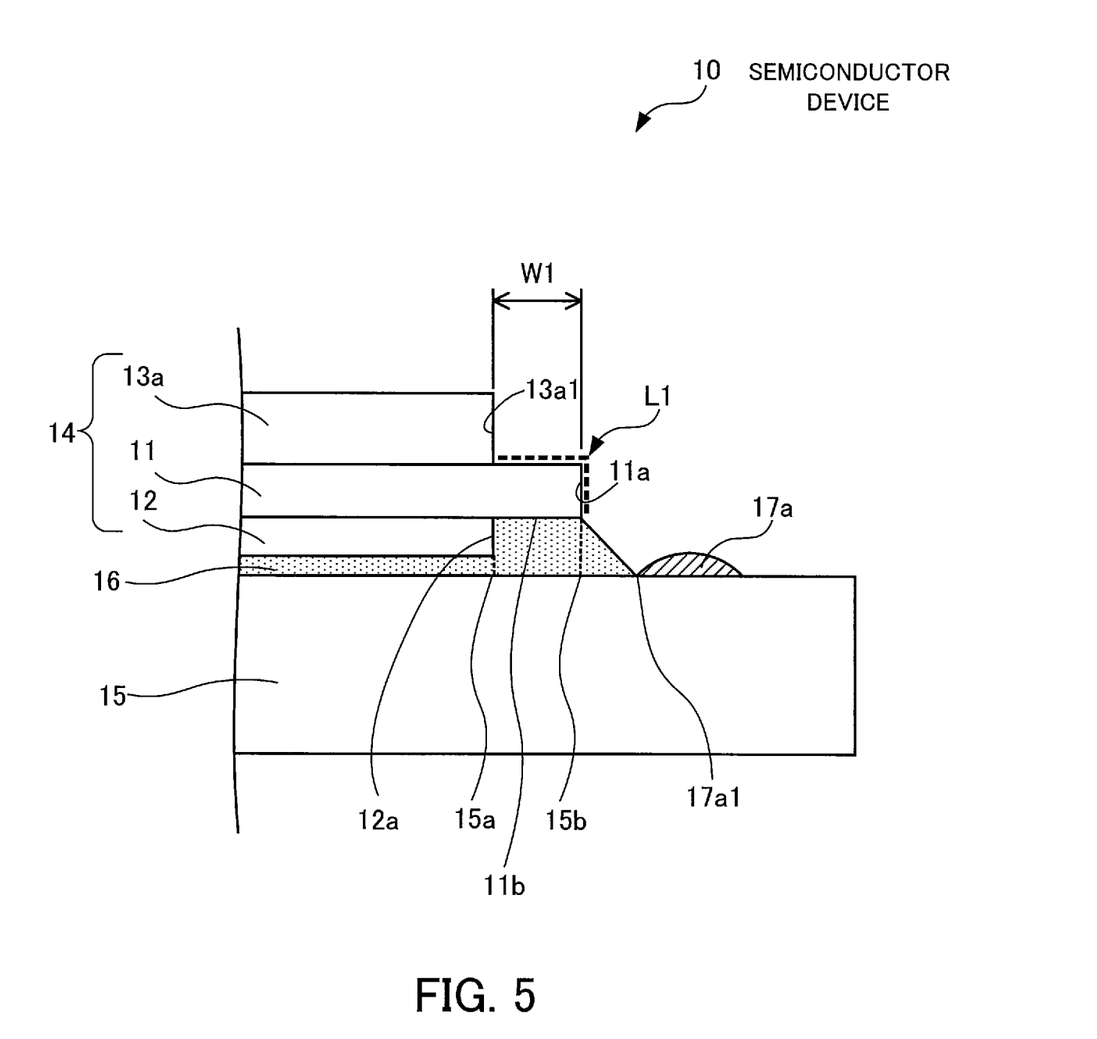
FIG. 5 is a cross-sectional view for explaining where a resist member is formed in the semiconductor device according to the first embodiment.

The following describes where the resist members 17a and 17b are formed on the metal base plate 15 with respect to the substrate 14, with reference to FIGS. 2, 4, and 5.

FIGS. 4 and 5 are cross-sectional views for explaining where a resist member is formed in the semiconductor device according to the first embodiment. In this connection, FIGS. 4 and 5 are the cross-sectional views of the semiconductor device 10 taken along the dot-dash line X1-X1 in FIG. 1.

It is desirable that the insulation distance L1 between the conductive pattern 13a and the solder include at least part of the length equal to the height of the side surface 11a of the electrical insulating board 11. Therefore, it is considered that the resist member 17a is formed such that its marginal edge 17a1 on the side closer to the substrate 14 is located on the metal base plate 15 between a position 15a illustrated in FIG. 4, which is directly under the side surface 12a of the metal plate 12, and the position 15b illustrated in FIG. 2, which is directly under the side surface 11a of the electrical insulating board 11. It is also considered that the resist member 17a is formed such that its marginal edge 17a1 is located on the metal base plate 15 between the position 15a illustrated in FIG. 4 and a position in the vicinity of the position 15b directly under the side surface 11a of the electrical insulating board 11 in FIG. 5.

Hereinafter, side surfaces of the metal plate 12 facing the periphery of the substrate 14 are referred to as third side surfaces. For example, the side surface 12a is a third side surface. Similarly, side surfaces of the electrical insulating board 11 facing the periphery of the substrate 14 are referred to as second side surfaces. For example, the side surface 11a is a second side surface. The position 15a directly under the side surface 12a (third side surface) on the metal base plate 15 is referred to as a third position. Similarly, the position 15b directly under the side surface 11a (second side surface) on the metal base plate 15 is referred to as a second position.

In this connection, in FIGS. 2, 4, and 5, the side surface 13a1 (first side surface) which is a side surface of the conductive pattern 13a facing the periphery of the substrate 14 and the side surface 12a (third side surface) which is a side surface of the metal plate 12 facing the periphery of the substrate have the same distance from the side surface 11a (second side surface) which is a side surface of the electrical insulating board 11 facing the periphery of the substrate 14, but may have different distances therefrom. In the substrate 14, as long as the side surface 11a (second side surface) is provided as an outermost surface, the side surface 13a1 (first side surface) may be located inside the side surface 12a (third side surface), or the side surface 12a (third side surface) may be located inside the side surface 13a1 (first side surface).

In the case of FIG. 4, the marginal edge 17a1 of the resist member 17a on the side closer to the substrate 14 on the metal base plate 15 is located at the position 15a (third position), so that the rear surface 11b of the projecting portion of the electrical insulating board 11 is not covered with the solder 16. The insulation distance L1 between the conductive pattern 13a and the solder 16 is the sum of the length of the rear surface 11b of the projecting portion, the length equal to the height of the side surface 11a of the electrical insulating board 11, and the creepage distance W1. In this case, the insulation distance L1 is the maximum distance. Therefore, it is also possible to minimize the creepage distance W1 of the conductive pattern 13a over the electrical insulating board 11. In this connection, if the marginal edge 17a1 of the resist member 17a on the side closer to the substrate 14 is located between the metal plate 12 and the metal base plate 15 inside the substrate 14, i.e., inside the position 15a (third position), the joining strength of the solder 16 between the metal plate 12 and the metal base plate 15 becomes low, and thus this configuration is not preferable.

In addition, in the case of FIG. 2, the marginal edge 17a1 of the resist member 17a on the side closer to the substrate 14 on the metal base plate 15 is located at the position 15b (second position). Therefore, the solder 16 partly covers the rear surface 11b of the projecting portion of the electrical insulating board 11. The insulation distance L1 between the conductive pattern 13a and the solder 16 is the sum of the length of a part of the projecting portion of the rear surface 11b not covered with the solder 16, the length equal to the height of the side surface 11a of the electrical insulating board 11, and the creepage distance W1. This enables the conductive pattern 13a to have a sufficient insulation distance L1 from the solder 16. Therefore, it is also possible to reduce the creepage distance W1 of the conductive pattern 13a over the electrical insulating board 11.

Figure 3:
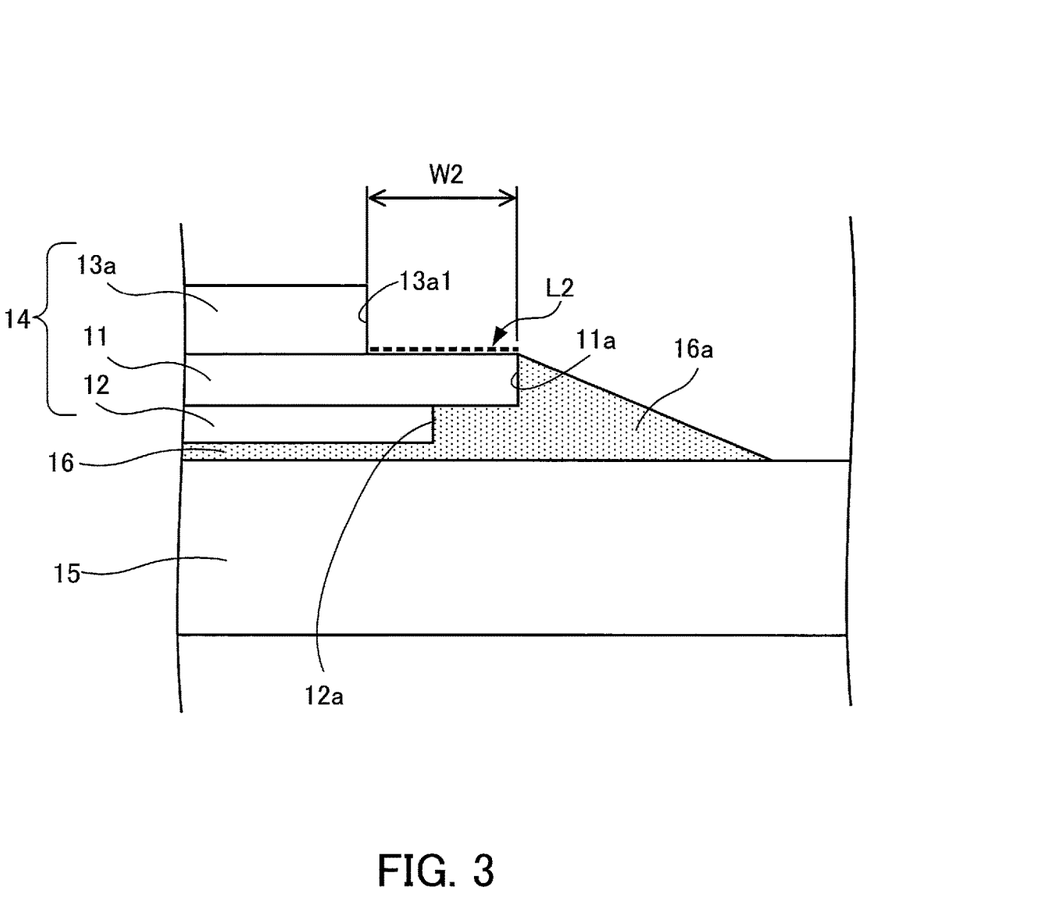
FIG. 3 is a cross-sectional view of a portion without a resist member in the semiconductor device according to the first embodiment.

Therefore, according to the above description regarding FIGS. 2 to 4, the resist member 17a is formed on the metal base plate 15 such that its marginal edge 17a1 is located between the position 15a (third position) illustrated in FIG. 4 and the position 15b (second position) illustrated in FIG. 2. By doing so, it becomes possible to ensure a longer insulation distance L1 between the conductive pattern 13a and the solder 16, compared with the case where the resist member 17a is not formed as illustrated in FIG. 3. Therefore, as illustrated in FIGS. 2 and 4, it is possible to reduce the creepage distance W1 of the conductive pattern 13a over the electrical insulating board 11 to shorter than the creepage distance W2 illustrated in FIG. 3.

In addition, in the case of FIG. 5, the marginal edge 17a1 of the resist member 17a on the side closer to the substrate 14 on the metal base plate 15 is located in the vicinity of the position 15b (second position). Since the solder 16 covers the rear surface 11b of the projecting portion of the electrical insulating board 11, the insulation distance L1 between the conductive pattern 13a and the solder 16 is the sum of the length equal to the height of the side surface 11a of the electrical insulating board 11 and the creepage distance W1. This enables the conductive pattern 13a to have a sufficient insulation distance L1 from the solder 16.

In this connection, the positional relations of the resist member 17a on the metal base plate 15 with respect to the conductive patterns 13b, 13d, and 13e are the same as above. In addition, the resist member 17b is formed at an appropriate position on the metal base plate 15 such as to have the same positional relations with respect to the conductive patterns 13i, 13k, 13l, and 13n as the resist member 17a.

Figure 6:
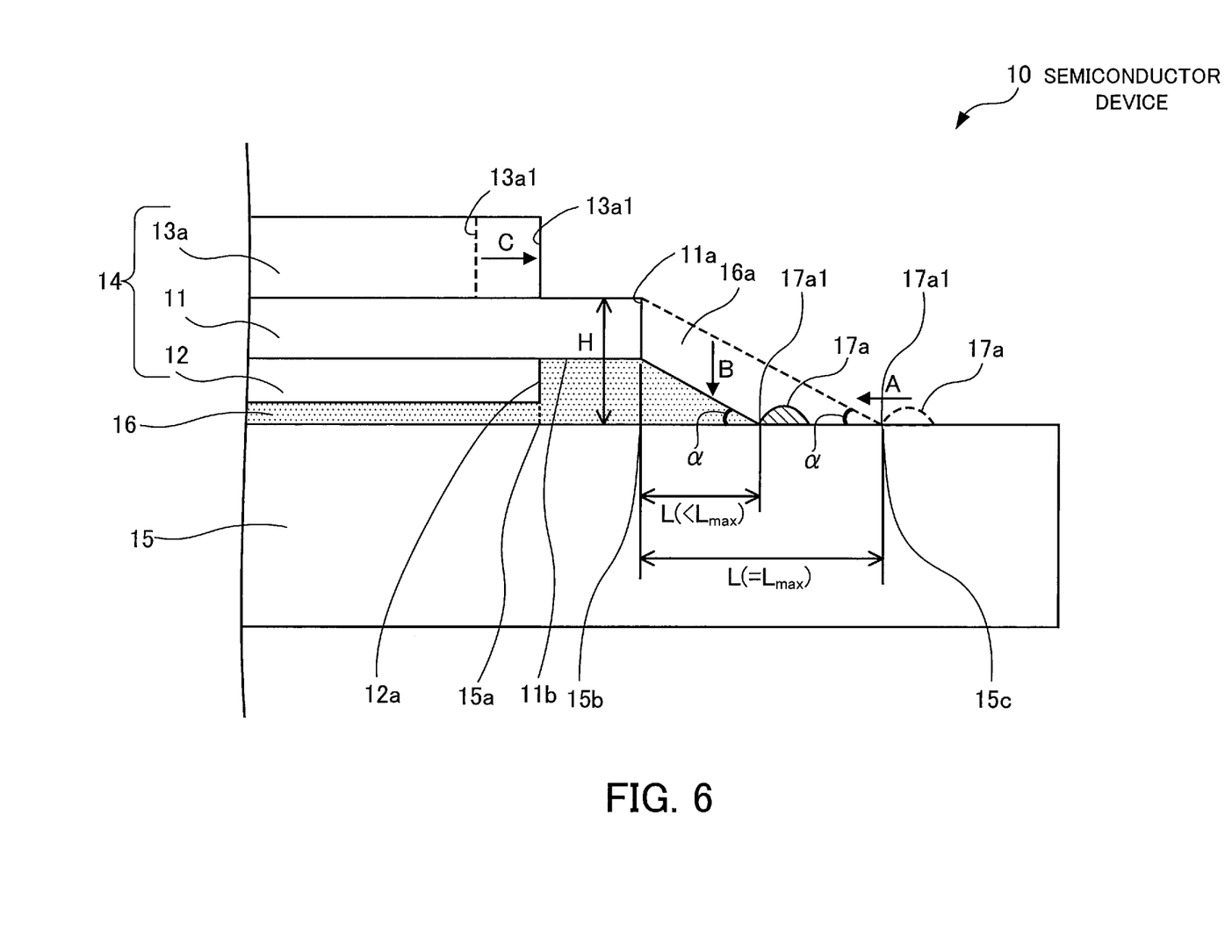
FIG. 6 is a cross-sectional view for explaining where a resist member is formed in the semiconductor device according to the first embodiment.

The following describes the case of displacing the resist member 17a from the position in the vicinity of the position 15b (second position) directly under the side surface 11a of the electrical insulating board 11 in FIG. 5 to a position closer to the periphery of the metal base plate 15, with reference to FIG. 6.

FIG. 6 is a cross-sectional view for explaining where a resist member is formed in the semiconductor device according to the first embodiment. In FIG. 6, the height from the front surface of the metal base plate 15 to the front surface of the electrical insulating board 11 is taken as H, and the length from the position 15b (second position) directly under the side surface 11a (second side surface) of the electrical insulating board 11 on the metal base plate 15 to the marginal edge 17a1 of the resist member 17a is taken as L.

In the case where the resist member 17a is formed such that its marginal edge 17a1 is located at a position 15c indicated by a broken line (hereinafter, referred to as a first position), the extrusion 16a of the solder 16 from the substrate 14 entirely covers the rear surface 11b and side surface 11a of the projecting portion of the electrical insulating board as indicated by a broken line. In this case, L ($=L_{max}$) is expressed as the following equation (1):

$$L = H/(\tan \alpha) = L_{max} \qquad (1)$$

In this equation, α denotes a contact angle between the metal base plate 15 and the solder 16 in the extrusion 16a of the solder 16. This contact angle α is an angle at which the solder melts by heating at the time of solder bonding, and is maintained after solder solidification. The contact angle α may be caused by the resist member 17a stopping a flow out of the solder 16. This contact angle α may be adjusted by changing the material for the solder 16, the surface state of the metal base plate 15, the temperature for solder melting, and so on. It is preferable that α be from 30° to 60° both inclusive. In the case of the contact angle α of 30°, $L_{max}=H\sqrt{3}$ (square root of three) is obtained. For example, in the case where the electrical insulating board 11 in the substrate 14 has a thickness of 0.64 mm, the metal plate 12 has a thickness of 0.40 mm, the solder 16 between the metal base plate 15 and the metal plate 12 has a thickness of 0.20 mm, and the contact angle α is 30°, $L_{max}$ is calculated as 2.15 mm.

In this case, to keep a sufficient insulation distance between the conductive pattern 13a and the extrusion 16a of the solder 16, the conductive pattern 13a needs to have a long creepage distance over the electrical insulating board 11. To this end, the side surface 13a1 (first side surface) of the conductive pattern 13a needs to be located at a position indicated by a broken line, for example.

With respect to the resist member 17a, its marginal edge 17a1 is displaced from the position 15c (first position) to the position 15b (second position) directly under the side surface 11a of the electrical insulating board 11 along an arrow A direction. Since the contact angle α of the solder 16 at the marginal edge 17a1 of the resist member 17a is fixed, the extrusion 16a of the solder 16 covering the side surface 11a (second side surface) of the electrical insulating board 11 is displaced in the arrow B direction. As a result, the side surface 11a (second side surface) of the electrical insulating board 11 is exposed, and the conductive pattern 13a has a longer insulation distance from the solder 16. Accordingly, it becomes possible to displace the side surface 13a1 (first side surface) of the conductive pattern 13a from the position indicated by the broken line to the position indicated by an actual line in an arrow C direction.

According to the above description regarding FIGS. 2 to 6, the resist member 17a is formed on the metal base plate 15 such that its marginal edge 17a1 is located between the position 15a (third position) illustrated in FIG. 4 and the position 15c (first position) illustrated in FIG. 6, so that the conductive pattern 13a and the solder 16 have a long insulation distance therebetween. At this time, the position 15b (second position) and the position 15c (first position) need to satisfy $0 < L < L_{max}$.

In this connection, the resist member 17a is formed on the metal base plate 15 such as to have the same positional relations with respect to the conductive patterns 13b, 13d, and 13e as above. In addition, the resist member 17b is formed on the metal base plate 15 such as to have the same positional relations with respect to the conductive patterns 13i, 13k, 13l, and 13n as the resist member 17a.

As described above, the semiconductor device 10 includes the substrate 14 including the electrical insulating board 11, the metal plate 12 disposed on the rear surface of the electrical insulating board 11, and the conductive patterns 13 formed on the front surface of the electrical insulating board 11, the metal base plate 15 having the front surface to which the metal plate 12 in the substrate 14 is joined by the solder 16, and the resist member 17a formed in a stripe shape on the metal base plate 15 in parallel to the outer side surfaces of the conductive patterns 13 in a planar view.

In this configuration, the marginal edge 17a1 of the resist member 17a on the side closer to the substrate 14 is located in the vicinity of the position 15b (second position) on the metal base plate 15 directly under the outer side surface 11a (second side surface) of the electrical insulating board 11. More specifically, the marginal edge 17a1 is located between the position 15a (third position) on the metal base plate 15 directly under the outer side surface 12a (third side surface) of the metal plate 12 and the position 15c (first position). The position 15c (first position) is away from the position 15b (second position) by a distance (H/(tan α)) calculated by dividing "the height H from the front surface of the metal base plate 15 to the front surface of the electrical insulating board 11" by "the tangent (tan α) of the contact angle α between the metal base plate 15 and the solder 16". For example, the marginal edge 17a1 of the resist member 17a on the side closer to the substrate 14 is located between the position 15a (third position) and the position 15c (first position) that is away outwardly from the position 15b (second position) by "H$\sqrt{3}$". The resist member 17b is formed in the same way.

The above configuration enables the conductive patterns 13 to have sufficient insulation distances from the solder 16, thereby making it possible to reduce the creepage distances of the conductive patterns 13 over the electrical insulating board 11. Since it is possible to reduce the area of the electrical insulating board 11, it is also possible to reduce the area size of the semiconductor device 10 and to reduce the risk of insulation breakdown.

Second Embodiment

A semiconductor device 10a of a second embodiment will now be described with reference to FIG. 7.

Figure 7:
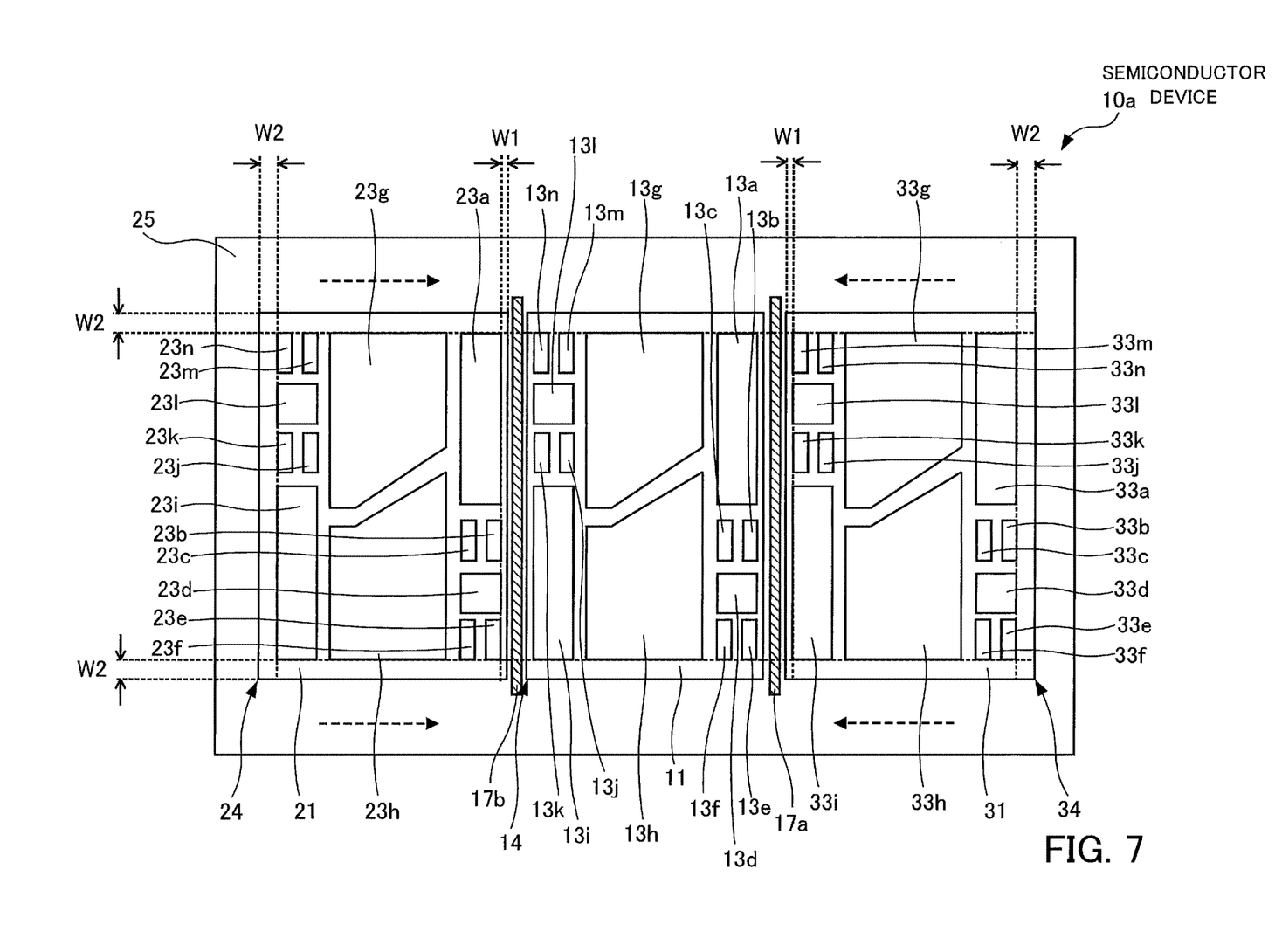
FIG. 7 is a plan view of a semiconductor device according to a second embodiment.

FIG. 7 is a plan view of the semiconductor device according to the second embodiment.

The semiconductor device 10a includes three substrates 14, 24, and 34, and a metal base plate 25 to which the substrates 14, 24, and 34 are joined in parallel by solder not illustrated.

As with the substrate 14 of the first embodiment, the substrates 24 and 34 each include an electrical insulating board 21, 31, a metal plate not illustrated which is disposed on the rear surface of the electrical insulating board 21, 31, and conductive patterns 23a to 23n, 33a to 33n formed on the front surface of the electrical insulating board 21, 31.

The electrical insulating boards 21 and 31 are made of the same material as the electrical insulating board 11 of the first embodiment. The metal plates are made of the same material as the metal plate 12 of the first embodiment. In addition, the conductive patterns 23a to 23n and 33a to 33n are made of the same material as the conductive patterns 13a to 13n of the first embodiment.

The metal base plate 25 is made of the same material as the metal base plate 15 of the first embodiment, and is subjected to the same plating process as the metal base plate 15. In addition, the metal base plate 25 has a rectangular shape in a planar view.

The substrate 14 is joined to the center of the front surface of the metal base plate 25, and resist members 17a and 17b are formed along the substrate 14 on the right and left sides of the substrate 14 in FIG. 7. In addition, the substrate 24 is joined to the front surface of the metal base plate on the left side of the substrate 14 with the resist member 17b therebetween, and the substrate 34 is joined to the front surface of the metal base plate on the right side of the substrate 14 with the resist member 17a therebetween.

At this time, as in the first embodiment, the conductive patterns 13a, 13b, 13d, and 13e on the substrate 14 have a creepage distance W1, not illustrated, from the right side of the electrical insulating board 11 in FIG. 7. The conductive patterns 13e, 13f, 13h, and 13i have a creepage distance W2 from the bottom side of the electrical insulating board 11 in FIG. 7. The conductive patterns 13i, 13k, 13l, and 13n have the creepage distance W1, not illustrated, from the left side of the electrical insulating board 11 in FIG. 7. The conductive patterns 13m, 13n, 13g, and 13a have the creepage distance W2 from the top side of the electrical insulating board 11 in FIG. 7.

Therefore, as in the first embodiment illustrated in FIGS. 2, 4, and 5, the resist member 17a is formed, so that the creepage distance W1 of the conductive patterns 13a, 13b, 13d, and 13e in the substrate 14 over the electrical insulating board 11 is shorter than the creepage distance W2. Similarly, the resist member 17b is formed, so that the creepage distance W1 of the conductive patterns 13i, 13k, 13l, and 13n over the electrical insulating board 11 is shorter than the creepage distance W2.

In addition, the conductive patterns 23a, 23b, 23d, and 23e in the substrate 24 have the creepage distance W1 from the right side of the electrical insulating board 21 in FIG. 7. The conductive patterns 23e, 23f, 23h, and 23i have the creepage distance W2 from the bottom side of the electrical insulating board 21 in FIG. 7. The conductive patterns 23i, 23k, 23l, and 23n have the creepage distance W2 from the left side of the electrical insulating board 21 in FIG. 7. The conductive patterns 23m, 23n, 23g, and 23a have the creepage distance W2 from the top side of the electrical insulating board 21 in FIG. 7.

Therefore, as in the first embodiment illustrated in FIGS. 2, 4, and 5, with regard to the conductive patterns 23a, 23b, 23d, and 23e on the right side of the substrate 24 where the resist member 17b is formed in FIG. 7, the resist member 17b stops a flow out of solder, and this enables the conductive patterns 23a, 23b, 23d, and 23e to keep sufficient insulation distances from the solder. As a result, it is possible to reduce the creepage distance W1 of the conductive patterns 23a, 23b, 23d, and 23e over the electrical insulating board 21 to shorter than the creepage distance W2.

Because solder may flow out, the conductive patterns 23e, 23f, 23i, 23k, 23l, 23n, 23g, and 23a in the substrate 24 for which the resist member 17b is not formed have longer a creepage distance W2 from the bottom side, left side, top side of the electrical insulating board 21 than the creepage distance W1 in FIG. 7.

In addition, the conductive patterns 33a, 33b, 33d, and 33e in the substrate 34 have the creepage distance W2 from the right side of the electrical insulating board 31 in FIG. 7. The conductive patterns 33e, 33f, 33h, and 33i have the creepage distance W2 from the bottom side of the electrical insulating board 31 in FIG. 7. The conductive patterns 33i, 33k, 33l, and 33n have the creepage distance W1 from the left side of the electrical insulating board 31 in FIG. 7. The conductive patterns 33m, 33n, 33g, and 33a have the creepage distance W2 from the top side of the electrical insulating board 31 in FIG. 7.

Therefore, as in the first embodiment illustrated in FIGS. 2, 4, and 5, with regard to the conductive patterns 33i, 33k, 33l, and 33n on the left side of the substrate 34 where the resist member 17a is formed, the resist member 17a stops a flow out of solder, and this enables the conductive patterns 33i, 33k, 33l and 33n to keep sufficient insulation distances from the solder. As a result, it is possible to reduce the creepage distance W1 of the conductive patterns 33i, 33k, 33l, and 33n over the electrical insulating board 31 to shorter than the creepage distance W2.

Because solder may flow out, the conductive patterns 33a, 33b, 33d, 33e, 33f, 33g, 33i, 33m, and 33n in the substrate 34 for which the resist member 17a is not formed have a longer creepage distance W2 from the right side, bottom side, and top side of the electrical insulating board 31 than the creepage distance W1 in FIG. 7.

By the way, the metal base plate 25 that has a rectangular shape in a planar view has a strong tendency to warp in a concave shape with the center of its front surface oriented toward the bottom. Therefore, solder not illustrated for joining the substrates 14, 24, and 34 to the metal base plate 25 as illustrated in FIG. 7 flows on the metal base plate 25 in directions indicated by broken arrows of FIG. 7. To deal with this, the resist members 17a and 17b are formed on the right and left sides of the substrate 14 in FIG. 7. These resist members 17a and 17b are able to stop the flow out of solder on the metal base plate 25 in the directions indicated by the broken arrows of FIG. 7.

As described above, in the semiconductor device 10a of FIG. 7, other substrates 24 and 34 are disposed on the metal base plate 25 on the sides of the substrate 14 with the resist members 17a and 17b therebetween. That is, using a few resist members 17a and 17b, it is possible to efficiently reduce the creepage distances of the conductive patterns 13 over the electrical insulating board 11. This reduces the area size of the semiconductor device 10a, and also reduces the risk of insulation breakdown. In addition, a flow out of solder across the substrates 14, 24, and is prevented, and therefore an even amount of solder is obtained among the substrates 14, 24, and 34. This makes it possible to prevent the generation of void non-joined areas in the solder in the spaces between the substrates 14, 24, and 34 and the metal base plate 25, and to prevent an excess flow out of solder from the substrates 14, 24, and 34.

Third Embodiment

A semiconductor device 10b of a third embodiment will now be described with reference to FIG. 8.

Figure 8:
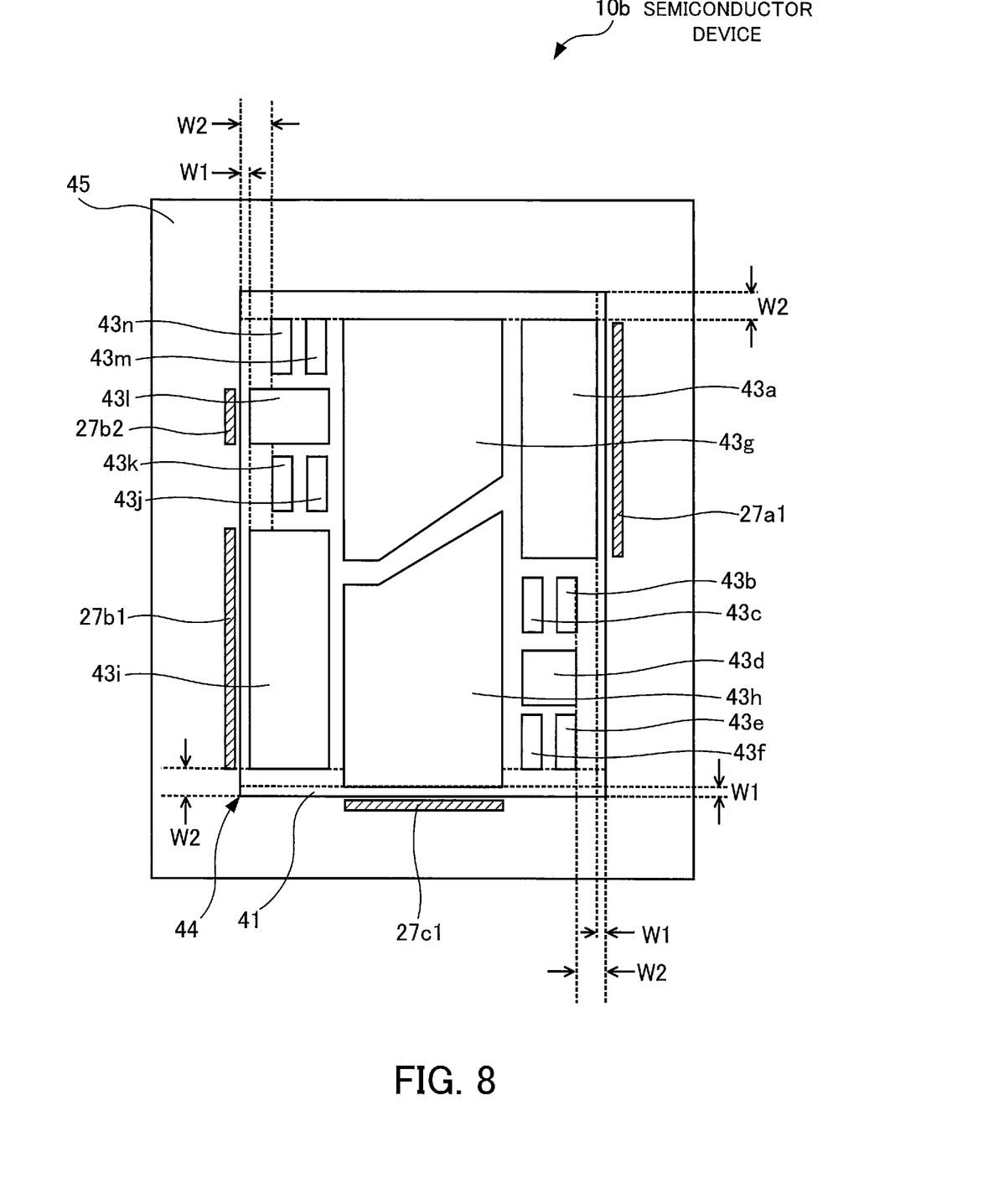
FIG. 8 is a plan view of a semiconductor device according to a third embodiment.

FIG. 8 is a plan view of the semiconductor device according to the third embodiment.

The semiconductor device 10b includes a substrate 44, and a metal base plate 45 to which the substrate 44 is joined by solder not illustrated.

As with the substrate 14 of the first embodiment, the substrate 44 includes an electrical insulating board 41, a metal plate not illustrated which is disposed on the rear surface of the electrical insulating board 41, and conductive patterns 43a to 43n formed on the front surface of the electrical insulating board 41.

In this connection, the electrical insulating board 41 is made of the same material as the electrical insulating board 11 of the first embodiment. The metal plate is made of the same material as the metal plate 12 of the first embodiment. Furthermore, the conductive patterns 43a to 43n are made of the same material as the conductive patterns 13a to 13n of the first embodiment.

The metal base plate 45 is made of the same material as the metal base plate 15 of the first embodiment, and is subjected to the same plating process as the metal base plate 15 of the first embodiment.

The metal plate on the rear surface of the substrate 44 is joined to the front surface of the metal base plate 45 by solder, and resist members 27a1, 27b1, 27b2, and 27c1 are appropriately formed along sides of the substrate 44.

More specifically, the resist member 27a1 is formed on the right side of the substrate 44 on the metal base plate 45 such as to face the right side surface of the conductive pattern 43a in FIG. 8. The resist member 27b1 is formed on the left side of the substrate 44 on the metal base plate 45 such as to face the left side surface of the conductive pattern 43i in FIG. 8. The resist member 27b2 is formed on the left side of the substrate 44 on the metal base plate 45 such as to face the left side surface of the conductive pattern 43l in FIG. 8. The resist member 27c1 is formed on the bottom side of the substrate 44 on the metal base plate 45 such as to face the bottom side surface of the conductive pattern 43h in FIG. 8.

That is to say, as in the first embodiment, with regard to the conductive patterns 43a, 43i, 43l, and 43h facing the resist members 27a1, 27b1, 27b2, and 27c1, the resist members 27a1, 27b1, 27b2, and 27c1 stop a flow out of solder, and this enables the conductive patterns 43a, 43i, 43l, and 43h to keep sufficient insulation distances from the solder. As a result, it is possible to reduce the creepage distance W1 of the conductive patterns 43a, 43i, 43l, and 43h over the electrical insulating board 51 to shorter than a creepage distance W2.

As described above, the conductive patterns 43a, 43i, 43l, and 43h are formed such as to face the resist members 27a1, 27b1, 27b2, and 27c1. This makes it possible to, for example, increase the areas of the principal surfaces of the conductive patterns 43a, 43i, 43l, and 43h to more than the areas of the principal surfaces of the conductive patterns 13a, 13i, 13l, and 13h of FIG. 9.

The resist members 27a1, 27b1, 27b2, 27c1 are not only for increasing the areas of the principal surfaces of the conductive patterns 43a, 43i, 43l, and 43h, but may be formed at locations where solder is easy to flow out from the substrate 44, in view of the warped state and others of the metal base plate 45.

The disclosed techniques make it possible to miniaturize a semiconductor device, to reduce the risk of insulation breakdown, and to prevent a reduction in the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a substrate having a front surface and a rear surface, and including
a conductive pattern having a first side surface,
an electrical insulating board having the conductive pattern on a front surface thereof, and having a second side surface parallel to the first side surface, and
a metal plate disposed on a rear surface of the electrical insulating board, having a third side surface parallel to the first and second side surfaces, the metal plate having a size that is smaller than a size of the electrical insulating board in a plan view so that the electrical insulating board extends beyond the metal plate;
a base plate having a principal surface;
a joining member disposed between the metal plate and the base plate to join the metal plate to the base plate; and
a resist member formed in a stripe shape on the base plate in parallel to the first side surface in a plan view, the resist member having a continuous linear structure,
wherein the base plate has first, second, and third positions, defined thereon in a cross-sectional view, the first position being outwardly away from the third position, the second position being directly under the second side surface, the third position being directly under the third side surface,
wherein the resist member has a marginal edge on a side closer to the substrate, and the marginal edge is located between the third position and the first position in the cross-sectional view, and
wherein the first position is away from the second position by a distance calculated by dividing "a height from the principal surface of the base plate to the front surface of the electrical insulating board" by "a tangent of a contact angle between the base plate and the joining member",
wherein the second side surface of the electrical insulating board is located closer to the first position than is the third side surface of the metal plate, and
wherein the joining member on the base plate entirely covers the rear surface and the third side surface of the metal plate, and covers a rear surface of the electrical insulating board from the third side surface of the metal plate toward the second side surface of the electrical insulating board.

2. A semiconductor device comprising:
a substrate having a front surface and a rear surface, and including
a conductive pattern having a first side surface, an electrical insulating board having the conductive pattern on a front surface thereof, and having a second side surface parallel to the first side surface, and a metal plate disposed on a rear surface of the electrical insulating board, having a third side surface parallel to the first and second side surfaces, the metal plate having a size that is smaller than a size of the electrical insulating board in a plan view so that the electrical insulating board extends beyond the metal plate;

a base plate having a principal surface;

a joining member disposed between the metal plate and the base plate to join the metal plate to the base plate; and a resist member formed in a stripe shape on the base plate in parallel to the first side surface in a plan view, the resist member having a continuous linear structure, wherein the base plate has first, second, and third positions defined thereon in a cross-sectional view, the first position being outwardly away from the third position, the second position being directly under the second side surface, the third position being directly under the third side surface, wherein the resist member has a marginal edge on a side closer to the substrate, and the marginal edge is located between the third position and the first position in the cross-sectional view, and wherein the first position is away from the second position by a distance calculated by multiplying "a height from the principal surface of the base plate to the front surface of the electrical insulating board" by $\sqrt{3}$, wherein the second side surface of the electrical insulating board is located closer to the first position than is the third side surface of the metal plate, and wherein the joining member on the base plate entirely covers the rear surface and the third side surface of the metal plate, and covers a rear surface of the electrical insulating board from the third side surface of the metal plate toward the second side surface of the electrical insulating board.

3. The semiconductor device according to claim 1, wherein the resist member includes first and second parallel resist members, the first parallel resist member being disposed at a position along one side of the substrate, the second parallel resist member being disposed at a position along another side of the substrate.

4. The semiconductor device according to claim 1, wherein the marginal edge of the resist member is located between the third position and the second position on the base plate in the cross-sectional view.

5. The semiconductor device according to claim 1, wherein the resist member is formed on the base plate to face the first side surface of the conductive pattern in the plan view.

6. The semiconductor device according to claim 1, further comprising another substrate disposed on the base plate, the resist member being sandwiched between the substrate and the another substrate.

7. A semiconductor device comprising:

a substrate having a front surface and a rear surface, and including a conductive pattern having a first side surface, an electrical insulating board having the conductive pattern on a front surface thereof, and having a second side surface parallel to the first side surface, and a metal plate disposed on a rear surface of the electrical insulating board, having a third side surface parallel to the first and second side surfaces, the metal plate having a size that is smaller than a size of the electrical insulating board in a plan view so that the electrical insulating board extends beyond the metal plate;

a base plate having a principal surface;

a joining member joining the rear surface of the substrate to the principal surface of the base plate; and a stripe-shaped resist member having a width and length, and being disposed on the principal surface of the base plate, the resist member extending in a length direction parallel to the first side surface in a plan view, one edge of the resist member in a width direction contacting the outer periphery portion of the joining member, the resist member having a continuous linear structure, wherein the second side surface of the electrical insulating board is located closer to the first position than is the third side surface of the metal plate, and wherein the joining member on the base plate entirely covers the rear surface and the third side surface of the metal plate, and covers a rear surface of the electrical insulating board from the third side surface of the metal plate toward the second side surface of the electrical insulating board.

8. The semiconductor device according to claim 7, wherein the one edge of the resist member contacts the end of the joining member at a position between the first side surface of the conductive pattern and the second side surface of the electrical insulating board.

9. The semiconductor device according to claim 1, wherein the marginal edge of the resist member is located between the first position and the second position on the base plate in the cross-sectional view.

10. The semiconductor device according to claim 1, wherein the base plate has a joining area in which the metal plate is joined to the base plate, and the resist member only partially surrounds the joining area of the base plate.

11. The semiconductor device according to claim 1, wherein a length of the resist member in its extending direction is equal to or greater than a length of the second side surface of the electrical insulating board in a direction parallel to the extending direction.

12. The semiconductor device according to claim 1, wherein the joining member on the base plate extends up to reach the marginal edge of the resist member.

13. The semiconductor device according to claim 1, wherein the first position is located at a side opposite to the third position with respect to the second position.

14. The semiconductor device according to claim 7, wherein the substrate is disposed within the base plate in a plan view, and the one edge of the resist member in said width direction contacts said outer periphery of the joining member on the base plate at a position outside of an area in which the substrate is disposed.

* * * * *